(12) United States Patent
Akedo

(10) Patent No.: US 6,827,634 B2
(45) Date of Patent: Dec. 7, 2004

(54) ULTRA FINE PARTICLE FILM FORMING METHOD AND APPARATUS

(75) Inventor: Jun Akedo, Tsukuba (JP)

(73) Assignee: Agency of Industrial Science and Technology, Tokyo (JP)

( * ) Notice: Subject to any disclaimer, the term of this patent is extended or adjusted under 35 U.S.C. 154(b) by 267 days.

(21) Appl. No.: 09/752,360

(22) Filed: Dec. 29, 2000

(65) Prior Publication Data

US 2001/0044259 A1 Nov. 22, 2001

(30) Foreign Application Priority Data

May 22, 2000 (JP) ........................................ 2000-150341

(51) Int. Cl.[7] ................................................. B24B 1/00
(52) U.S. Cl. ........................... 451/54; 451/55; 427/475; 427/190; 427/359; 427/560
(58) Field of Search ............................. 451/54, 55, 287; 427/475, 190, 193, 194, 359, 368, 369, 560

(56) References Cited

U.S. PATENT DOCUMENTS

| | | | | |
|---|---|---|---|---|
| 5,116,561 A | * | 5/1992 | Kagawa | ...................... 264/115 |
| 5,830,568 A | * | 11/1998 | Kondo | ........................ 428/328 |
| 5,981,305 A | * | 11/1999 | Hattori | ......................... 438/20 |
| 6,235,118 B1 | * | 5/2001 | Hayashi | ...................... 118/708 |
| 6,329,061 B2 | * | 12/2001 | Kondo | ........................ 428/432 |
| 6,531,187 B2 | * | 3/2003 | Akedo | ......................... 427/475 |
| 6,579,608 B1 | * | 6/2003 | Kondo | ........................ 428/323 |

OTHER PUBLICATIONS

Akedo et al. "Jet Molding System for Realization of Three–Dimensional Micro–Structures", Sensors and Actuators A69, 1998, 106–112.

JP–A–10–208998 Aug. 13, 1999 2963993.

JP–A–11–117328.

* cited by examiner

*Primary Examiner*—M. Rachuba
(74) *Attorney, Agent, or Firm*—Martin A. Farber

(57) ABSTRACT

A ultra fine particle film forming apparatus is provided which is capable of forming a ultra fine particle film which has ultra fine particles sufficiently bonded together, sufficient density, flat surface and uniform density. A planarized ultra fine particle film forming method for forming a planarized ultra fine particle film from a deposited film of ultra fine particles formed by supplying the ultra fine particles to a substrate, the method comprising one or more of a planarizing step of planarizing a surface of the deposited film of the ultra fine particles supplied to the substrate.

11 Claims, 11 Drawing Sheets

FIG. 7A
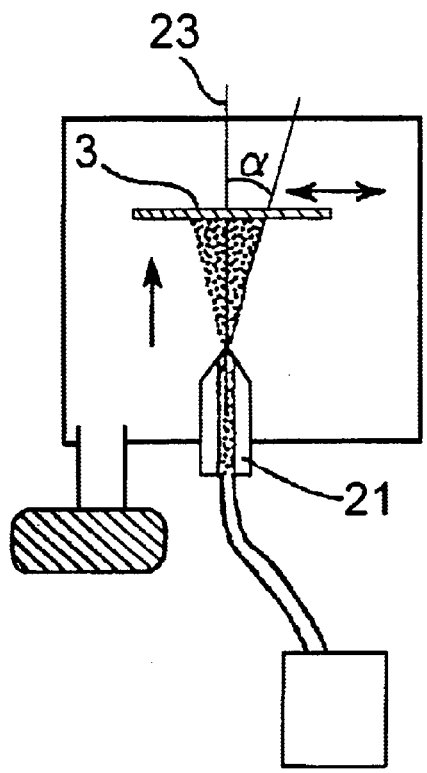
FIG. 7B
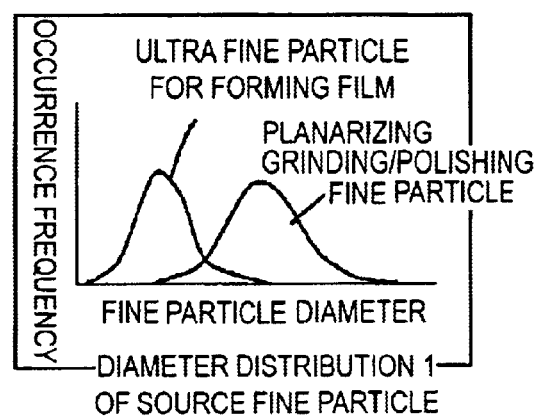
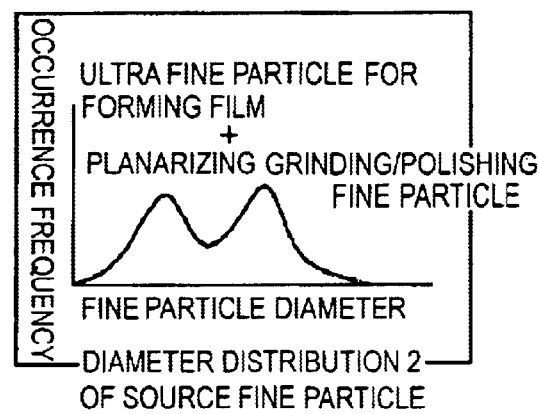
FIG. 7C (a)

(b)

(a) OBSTRUCTION OF ATTACHED FINE PARTICLES AGAINST NORMAL DEPOSITION (b) ABRASION OF DEPOSIT SURFACE BY FINE PARTICLES

EXAMPLE OF ROUGH SURFACE

ULTRA FINE PARTICLE FILM FORMING METHOD AND APPARATUS

BACKGROUND OF THE INVENTION a) Field of the Invention

The present invention relates to techniques of supplying ultra fine particles of ceramic, metal and the like not larger than about 1 μm to a substrate to form a ultra fine particle film. Such techniques of forming a ultra fine particle film are applied to the technical fields of forming a functional ceramic thin film, a metal thin film or the like on a substrate.

b) Description of the Related Art

As one of techniques of forming a ultra fine particle film, it is known to mix ultra fine particles with transport gas and spray the particles mixed with the transport gas from a nozzle toward a substrate surface to form a ultra fine particle film.

This conventional ultra fine particle film forming method is, however, associated with some problems that the film surface is not smooth and flat and the density of the film is not uniform. Specifically, with the conventional ultra fine particle film forming method, if ultra fine particles contain defective particles (such as particles having a diameter of 1 μm or larger and insufficiently accelerated particles) unable to physically form a film, these defective particles are mixed in a deposit on a substrate.

More specifically, if ultra fine particles jetted out during a film deposition contain a particle (defective particle) 31 having a large particle diameter or an insufficient speed, as shown in a schematic diagram of FIG. 9A and a microscopic photograph shown in FIG. 10A, the large diameter defective particle 31 attaches to and sinks in the surface layer of a deposit 32 under growth, and this defective particle 31 functions as a mask so that deposition does not occur thereafter on the surface of this defective particle 31. As shown in FIGS. 9A and 10B, the film 33 after cleaning has a depression 34. As shown in a microscopic photograph of FIG. 11, the film surface is very rough, which adversely affects later deposition. Since the defective particle is in a floating state in the deposit 32, the film is not dense and the surface of the deposit is abraded by ultra fine particles to be later blown toward the surface. Also in this case, as shown in FIG. 9B, the film 33 has a depression 34 and the film surface is very rough, which adversely affects later deposition. If such a conventional film forming method is applied to forming a ceramic electronic component which is required to have a homogeneously controlled fine structure of the film, excellent electrical characteristics cannot be expected.

It is also practically difficult to make the amount of fine particles to be jetted out of a nozzle uniform and constant, so that the film thickness changes at positions. It is also difficult to control a film thickness and a surface uniformity, which becomes a large obstacle against forming films having uniform performance and good film quality. Such irregular film thickness and surface roughness become a critical issue when the conventional method is applied to forming an optical thin film.

It has been desired to provide techniques of forming a ultra fine particle film which has ultra fine particles sufficiently bonded together, sufficient density, flat surface and uniform density.

SUMMARY OF THE INVENTION

The invention has been made under such circumstances. It is an object of the present invention to provide a ultra fine particle film forming apparatus capable of forming a ultra fine particle film which has ultra fine particles sufficiently bonded together, sufficient density, and particularly flat surface and uniform density.

In order to achieve the above object of the invention, there is provided a planarized ultra fine particle film forming method for forming a planarized ultra fine particle film from a deposited film of ultra fine particles formed by supplying the ultra fine particles to a substrate, the method comprising one or more of a planarizing step of planarizing a surface of the deposited film of the ultra fine particles supplied to the substrate.

According to another aspect of the invention, there is provided a planarized ultra fine particle film forming apparatus for forming a planarized ultra fine particle film from a deposited film of ultra fine particles formed by supplying the ultra fine particles to a substrate, the apparatus comprising at least one of: an attached particle removal apparatus for rolling or scraping a surface layer portion of the deposited film of the ultra fine particles supplied to the substrate; a film surface processing apparatus for grinding or polishing the surface layer portion; and a pressure apparatus for pressing the deposited film.

According to another aspect of the invention, there is provided a planarized ultra fine particle film forming method for forming a planarized ultra fine particle film from a deposited film of ultra fine particles formed by supplying the ultra fine particles to a substrate, the method comprising one or more of a planarizing step of planarizing a surface of the deposited film of the ultra fine particles by blowing planarizing fine particles having a grinding/polishing function at an oblique incidence angle toward the surface of the deposited film.

According to another aspect of the invention, there is provided a planarized ultra fine particle film forming apparatus for forming a planarized ultra fine particle film from a deposited film of ultra fine particles formed by supplying the ultra fine particles to a substrate, wherein planarizing fine particles having a grinding/polishing function are blown at an oblique incidence angle toward the surface of the deposited film.

BRIEF DESCRIPTION OF THE DRAWINGS

FIG. 7A is a schematic diagram showing another example of a spray apparatus for blowing ultra fine particles and planarizing particles, and FIGS. 7B and 7C are graphs showing a diameter distribution of planarizing fine particles and ultra fine particles.

DETAILED DESCRIPTION OF THE PREFERRED EMBODIMENTS

Embodiments of the invention will be described with reference to the accompanying drawings.

Figure 1:
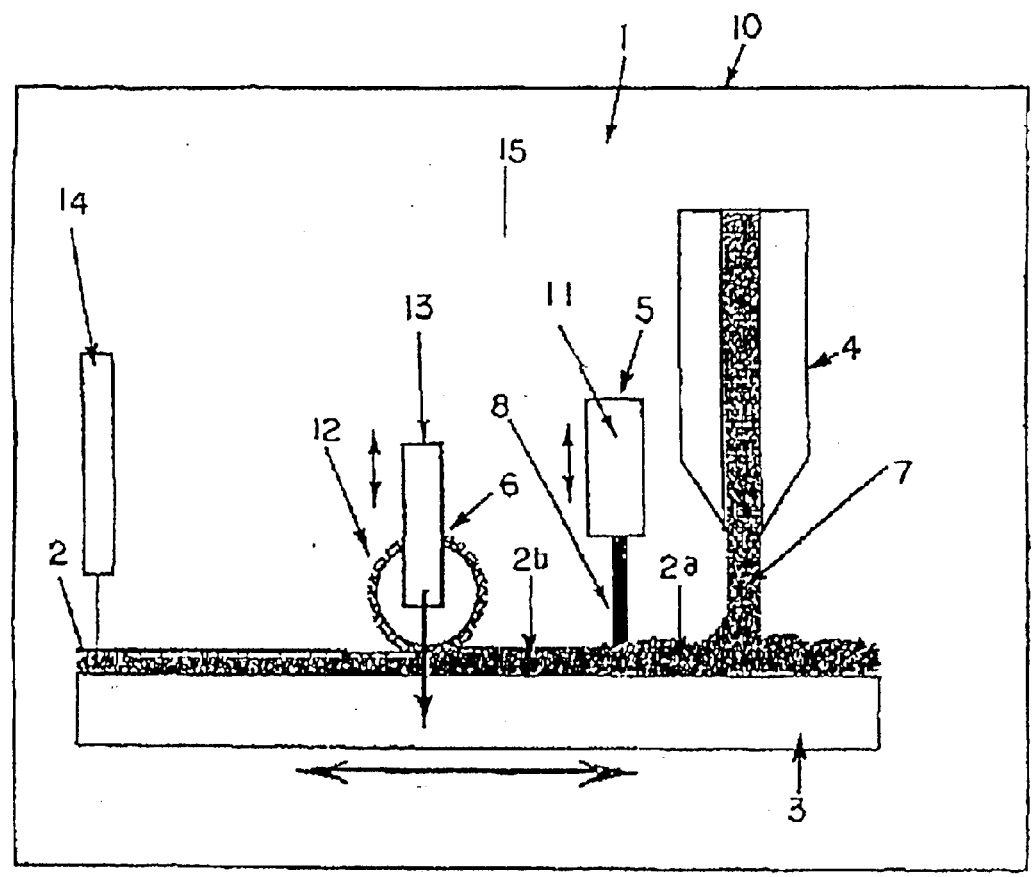
FIG. 1 is a schematic diagram showing the structure of a planarized ultra fine particle film forming apparatus according to an embodiment of the invention.

In FIG. 1, reference numeral 1 represents a planarized ultra fine particle film forming apparatus. The planarized ultra fine particle film forming apparatus 1 has a substrate 3 and a nozzle 4 disposed in a chamber 10. The nozzle 4 is an example of a ultra fine particle supply apparatus. The substrate 3 is used for supporting a film to be formed thereon. An attached fine particle removal apparatus 5 and a film surface processing apparatus 6 are disposed along a substrate motion path. The attached fine particle removal apparatus 5 and film surface processing apparatus 6 constitute a planarizing apparatus 15 for planarizing a deposited film 2a. The chamber 10 may be a vacuum chamber capable of reducing the inner pressure. If the vacuum chamber is used as the chamber 10, the vacuum degree is set to about 10 to 200 Torr, or preferably to about 100 Torr.

The nozzle 4 is used for supplying ultra fine particles to the substrate 3 to form a deposited film 2a. The substrate 3 is mounted on a substrate drive apparatus (not shown) so that it can be driven movably in the chamber. The nozzle 4 may be set so that it can also be driven movably in the chamber. Instead of jetting out transport gas and ultra fine particles from the nozzle 4 to the substrate 3, other methods may be used depending upon the type or other conditions of ultra fine particles, such as flowing ultra fine particles out of a slit upon application of fine vibrations.

The attached particle removal apparatus 5 scrapes the surface of the deposited film 2a of ultra fine particles 7 supplied to the substrate 3 to planarize the surface and remove defective particles: including ultra fine particles having a large diameter and protruding from the planarized surface and ultra fine particles attached on the planarized surface. The attached particle removal apparatus 5 has an attached particle removal blade 8 and a gap control mechanism 11. The attached particle removal blade 8 is made of hard rubber or a metal plate and is disposed near the nozzle 4. During the motion relative to the substrate 3, the attached particle removal apparatus 5 scrapes the surface of the deposited film 2a of ultra fine particles supplied from the nozzle 4 to the substrate 3 to remove defective particles such as embedded large diameter ultra fine particles and attached ultra fine particles and form a scraped film 2b. The scrape amount of the surface of the deposited film 2a by the attached particle removal blade 8 can be adjusted by controlling a gap between the attached particle removal blade 8 and substrate 3. This adjustment is performed by operating the gap control mechanism 11 to drive the attached particle removal blade 8.

The scraped film 2b formed by scraping a predetermined amount of the surface layer with the attached particle removal blade 8 is then processed by a film surface processing apparatus 6. The film surface processing apparatus 6 has a grinding/polishing roller 12 and a gap control mechanism 13. The grinding/polishing roller 12 is made of a polishing brush or a roller made of polishing material. The grinding/polishing roller 12 is rotated at a speed matching the substrate scan speed and made in contact with the surface scraped film 2b to grind and polish it to adjust the film thickness and form a final film 2. In this case, the film thickness before and after the grinding/polishing is measured by using a displacement gauge 14 such as an optical displacement gauge and an air micro displacement gauge. In accordance with the measured film thickness, the gap between the surface of the deposited film 2a and surface scraped film 2b and the grinding/polishing roller 12 and attached particle removal blade 8 is controlled. Adjustment of the gap and pressure is performed by using the gap control mechanisms 11 and 13.

In this embodiment, the deposited film 2a of ultra fine particles 7 supplied to the substrate 3 is processed twice, first by the attached particle removal apparatus 5 to form the surface scraped film 2b and then by the film surface processing apparatus to form a final film 2. If a film having the same property as the final film 2 can be obtained by one of the two processes, either a process by the attached particle removal apparatus 5 or a process by the film surface processing apparatus 6 may be executed.

In order to positively remove dusts to be generated while the film surface is ground/polished for film formation, a nozzle for jetting out a gas or a dust sucking mechanism may be installed near at the position where the film surface is ground/polished.

If metal ultra fine particles are used, it is necessary to pay more attention to making a film denser than using ceramic ultra fine particles which are brittle. In this context, it may be effective in some case to press the surface of the deposited film 2a with a roller to planarize the film surface by utilizing plastic deformation of metal. In this case, this roller is installed by replacing the grinding/polishing roller 12.

The planarizing process of rolling or scraping, grinding or polishing, or pressing the surface layer portion of a deposit of ultra fine particles supplied to the substrate, is executed each time the deposited film 2a of a single layer structure is formed by supplying ultra fine particles from the ultra fine particle supply apparatus to the substrate. A combination of a process of forming the deposited film of the single layer structure by a single supply of ultra fine particles and the planarizing process for the deposited film of the single layer structure may be performed a plurality of times. Alternatively, after a deposited film 2a of a multi-layer structure is formed by a plurality of supplies of ultra fine particles from the ultra fine particle supply apparatus, the planarizing process may be performed for the deposited film 2a of the multi-layer structure.

The former case of performing the planarizing process each time the deposited film of the single layer structure is formed, is effective for making the final film dense in its inner region.

Figure 2:
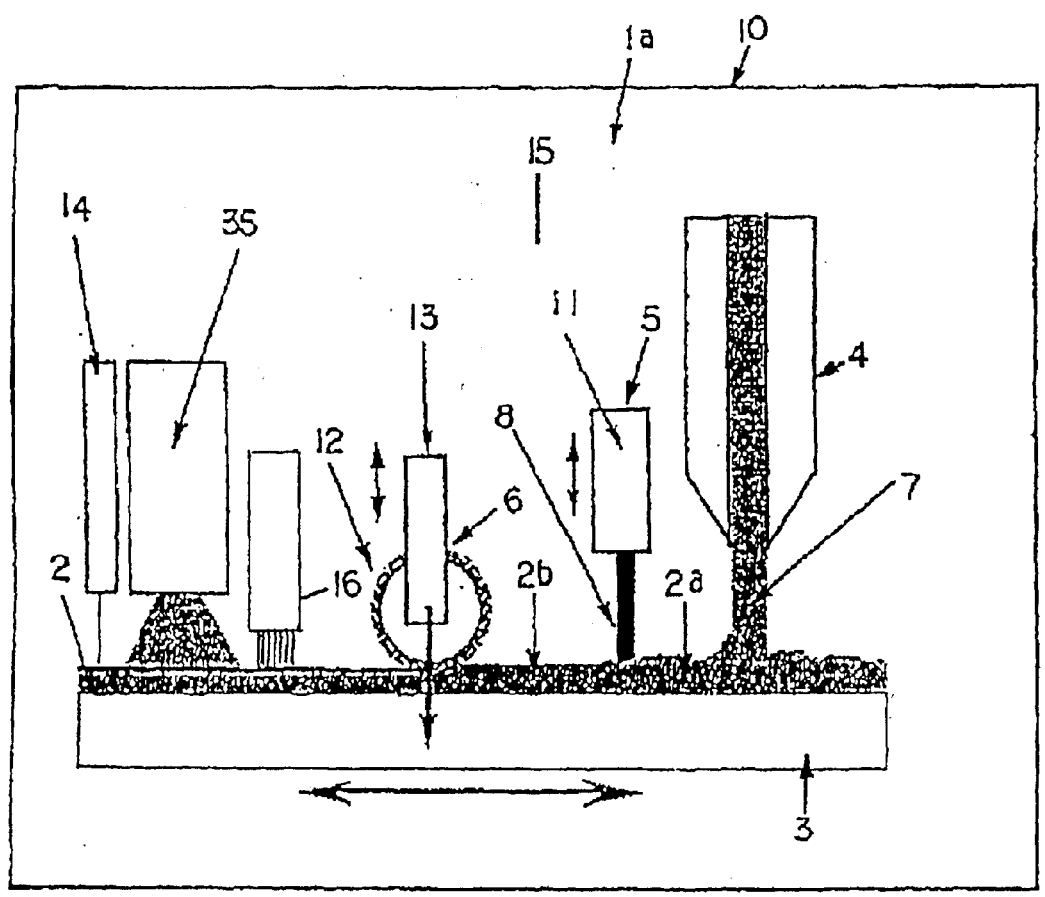
FIG. 2 is a schematic diagram showing the structure of a planarized ultra fine particle film forming apparatus according to another embodiment of the invention.

In the embodiment described above, in forming a ultra fine particle film, the planarizing process of rolling or scraping, grinding or polishing, or pressing the surface layer portion of a deposited film on the substrate, is executed. The invention is applicable to the film forming method (refer to JP-A-10-208998) and the film forming method (refer to JP-A-11-117328). With the former method, ion beams, plasma or the like is applied to ultra fine particles as source material or to the film surface during deposition to activate the ultra fine particles or the film surface during deposition and bond at a low temperature the ultra fine particles together or the film surface and ultra fine particles. With the latter method, a mechanical impact force is applied to the deposited film to crush ultra fine particles and bond the ultra fine particles of the deposited film. In this case, as shown in FIG. 2, a planarized ultra fine particle film forming apparatus 1a is provided with a plasma ion beam generator apparatus 35. A film may be formed by applying ion beams, plasma or the like to ultra fine particles or to the film surface during deposition, or a film may be formed through low temperature bonding of ultra fine particles by applying a mechanical impulse force which is generated: by accelerating ultra fine particles by an electrostatic field or gas transport and spraying them to and colliding them with ultra fine particles on the substrate; by using a brush or roller rotating at high speed, a pressure needle moving up and down at high speed, or a piston moving at high speed by explosion force; or by generating ultra sounds. Thereafter, the planarizing process of rolling or scraping, grinding or polishing, or pressing the surface layer portion of each of these films, is executed. Alternatively, a mechanical impact force loading apparatus 16 is used to load a mechanical impact force to ultra fine particles of a deposited film, a scraped film, or a ground/polished film to crush these ultra fine particles and bond them together. This mechanical impact force is applied to the deposited film: by accelerating ultra fine particles by an electrostatic field or gas transport and spraying them to and colliding them with ultra fine particles on the substrate; by using a brush or roller rotating at high speed, a pressure needle moving up and down at high speed, or a piston moving at high speed by explosion force; or by generating ultra sounds. If ultra fine particles of the deposited film are to be bonded by applying the mechanical impact force to the deposited film and crushing the ultra fine particles, the ultra fine particles may be processed beforehand so that they can be crushed easily by the mechanical impact force to be applied. This process may be a process of adjusting a preliminary baking temperature of ultra fine particles, a process of heating ultra fine particles prepared to have a particle diameter of about several tens nm and aggregating them to form secondary particles having a particle diameter of about 50 nm to 1 μm, or a process of forming cracks in ultra fine particles so as to make them easy to be crushed, by using for a long time period a breaker or crusher such as a ball mill, a jet mill, a vibration mill, an epicyclic mill and a bead mill.

As above, according to the invention, defective particles are removed to planarize the surface of a deposited film of ultra fine particles supplied from the nozzle, by rolling or scraping, grinding or polishing, or pressing the surface layer portion of the deposited film. If the film 2 is formed by pressing the deposited film, a pressure apparatus is used to press the deposited film 2a, the surface scraped film 2b, or the surface scraped film 2b after the grinding/polishing process. An example of the pressure apparatus is a pressure roller having a circumferential surface worked to have a mirror surface, in place of the grinding/polishing roller 12 shown in FIG. 1.

Figure 3:
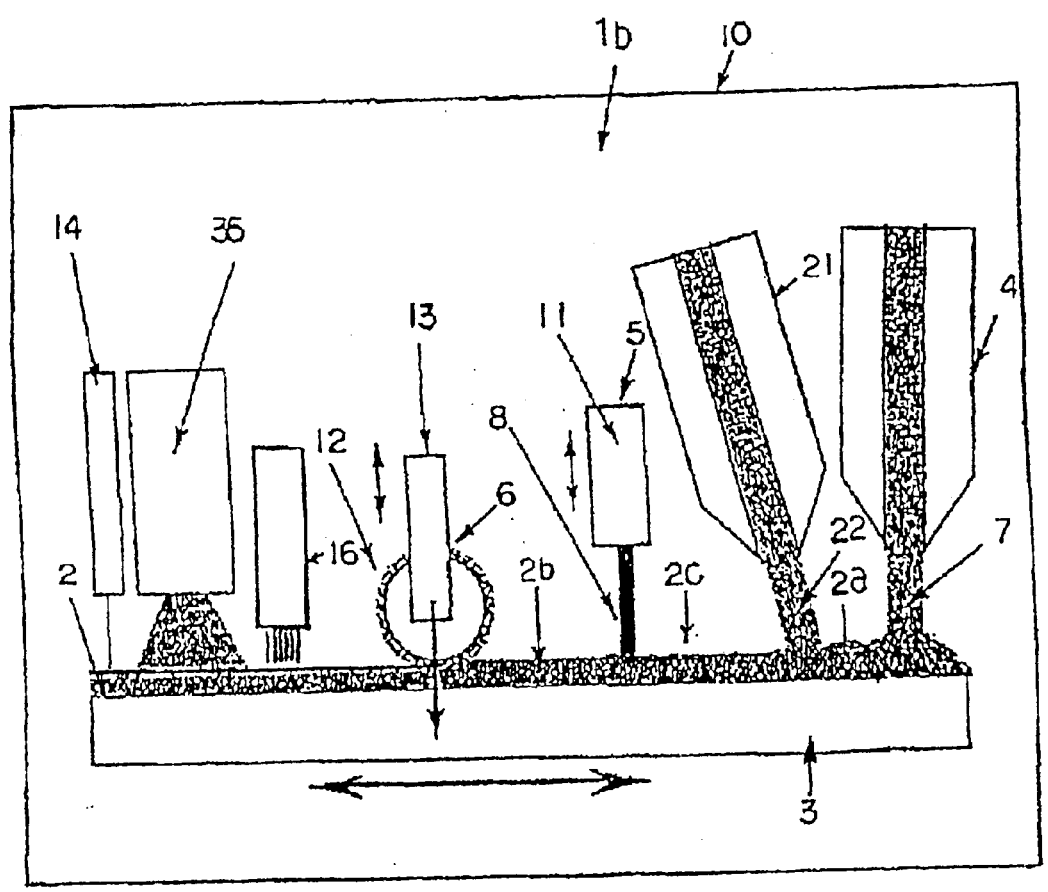
FIG. 3 is a schematic diagram showing the structure of a planarized ultra fine particle film forming apparatus according to still another embodiment of the invention.
Figure 4:
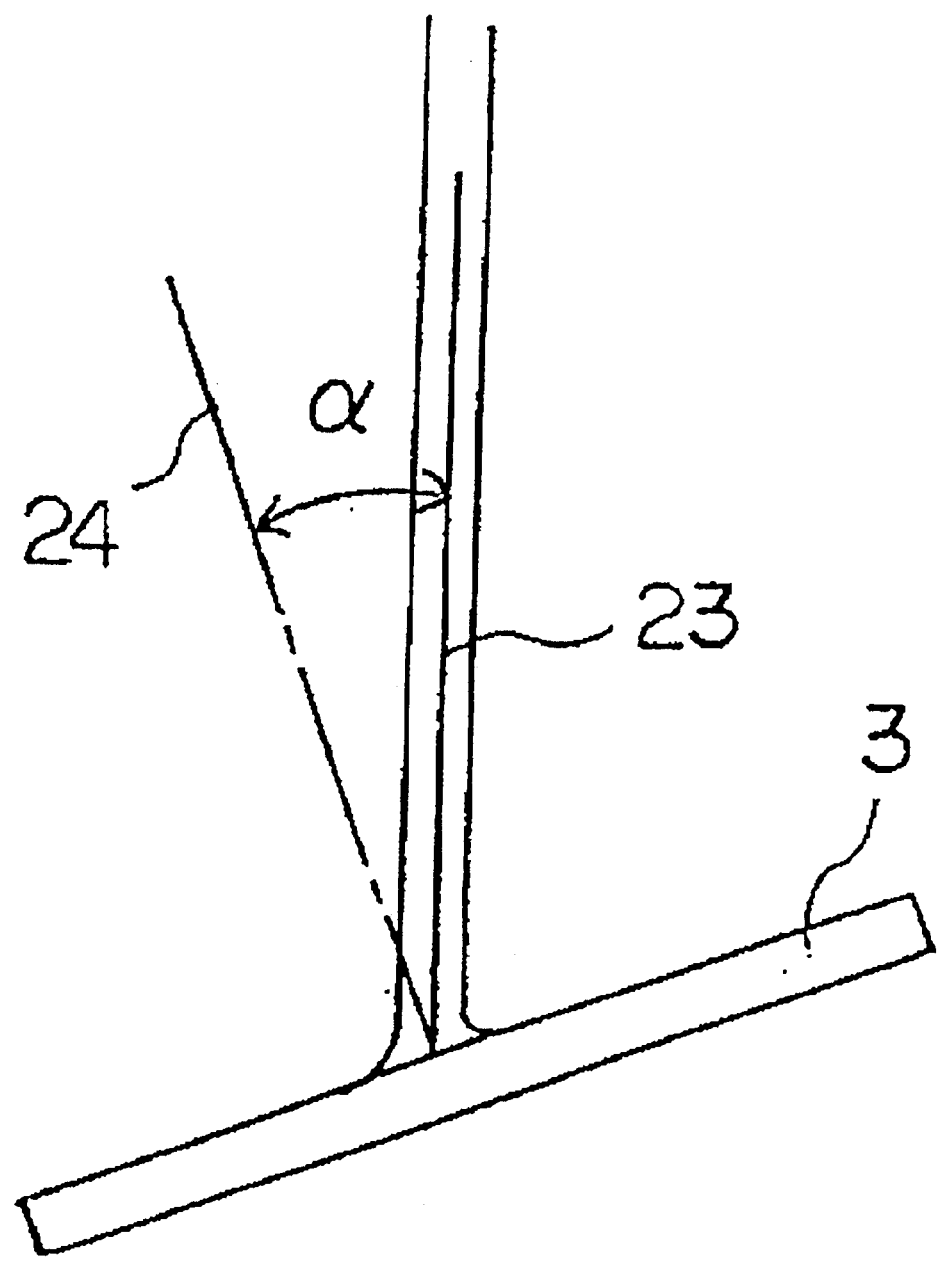
FIG. 4 is a schematic diagram showing an incidence angle of planarizing particles.
Figure 8:
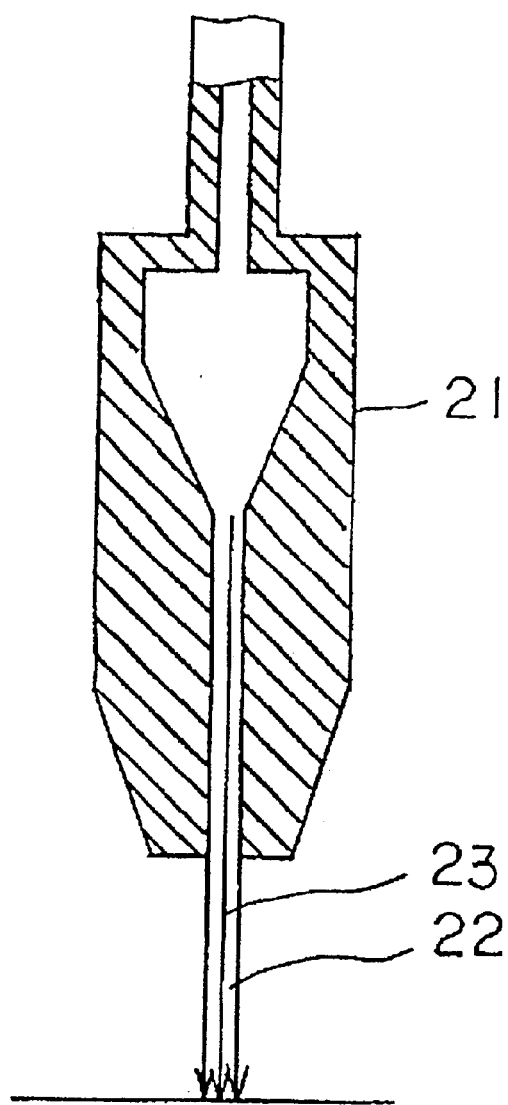
FIGS. 8A and 8B are vertical cross sectional views of spray apparatus.
Figure 8:
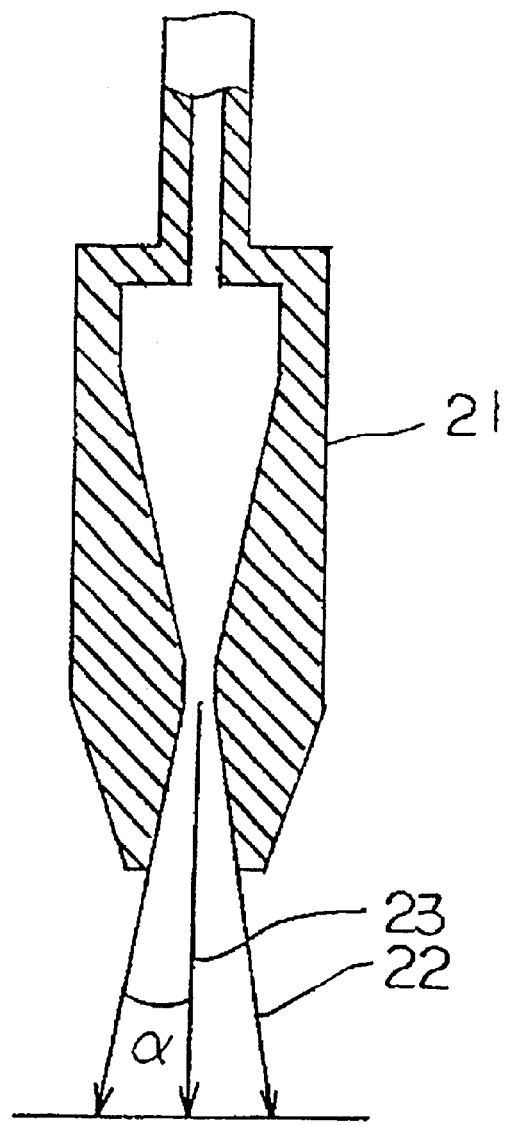
Figure 9:
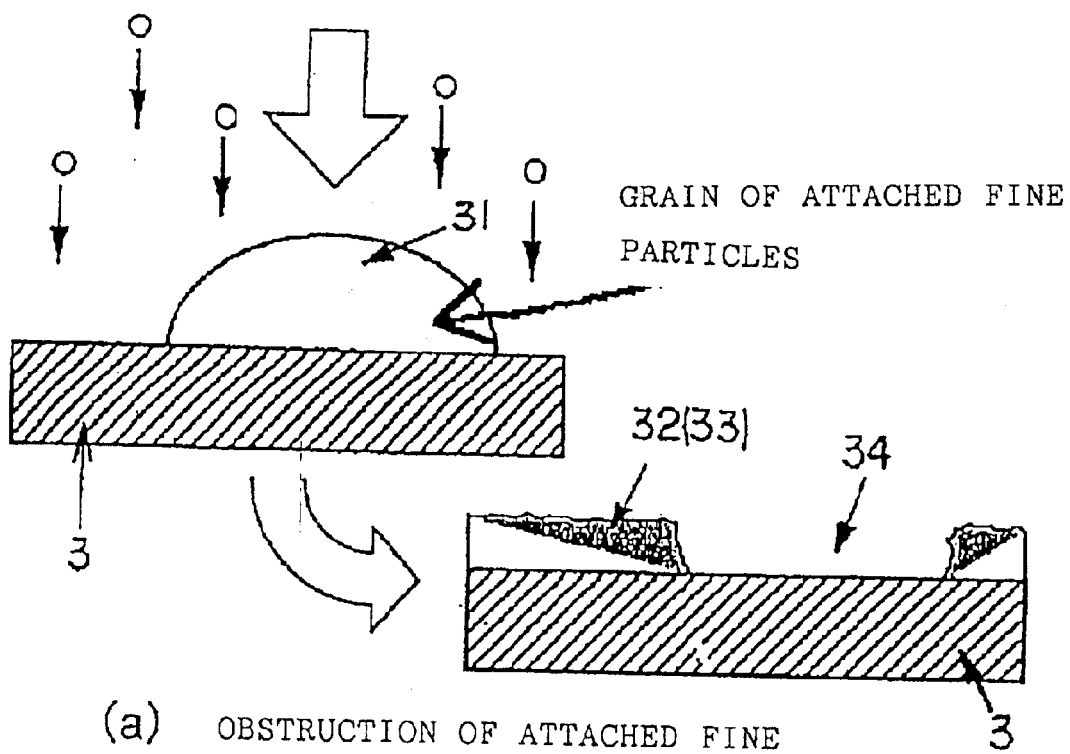
FIGS. 9A and 9B are cross sectional views showing deposited films.
Figure 9:
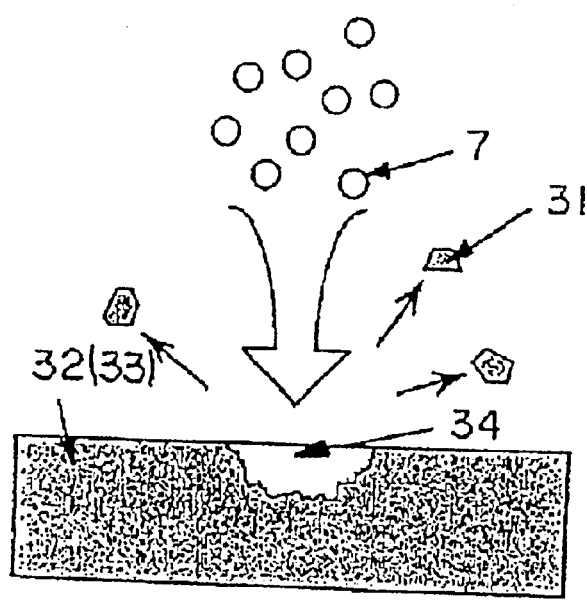
Figure 10:
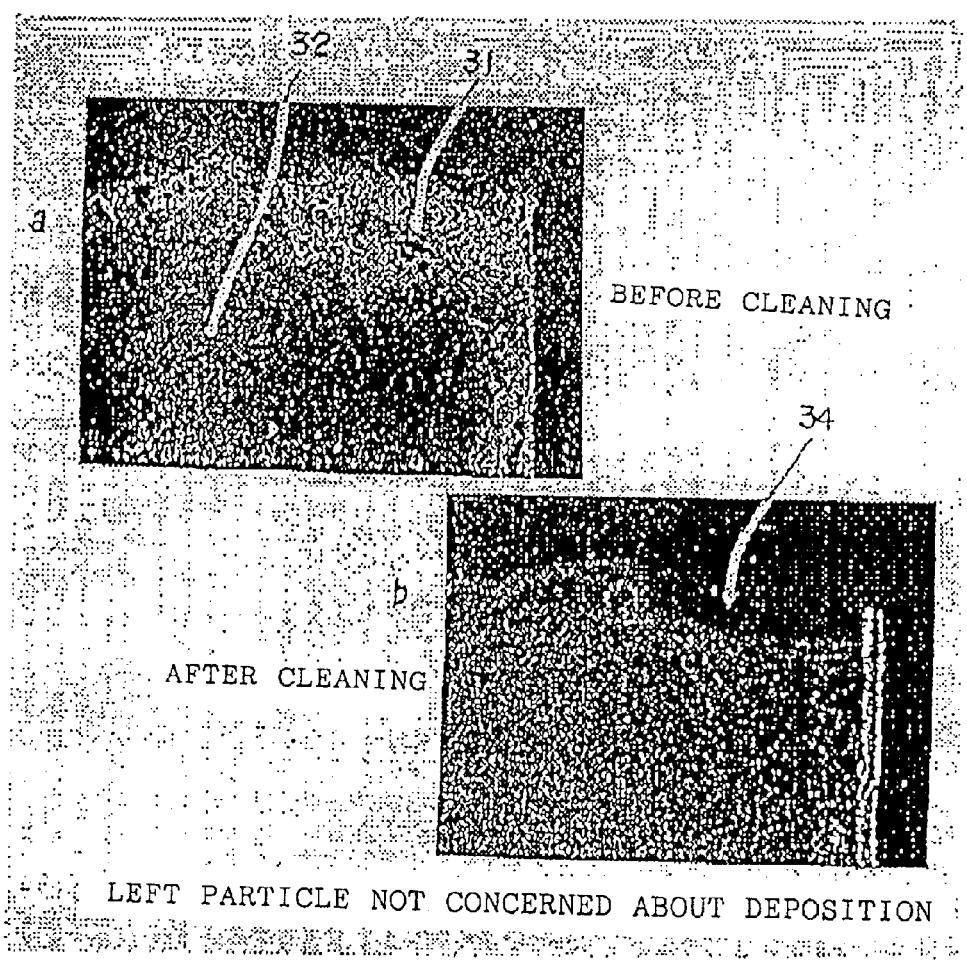
FIGS. 10A and 10B are microscopic photographs showing cross sectional views of deposited films.
Figure 11:
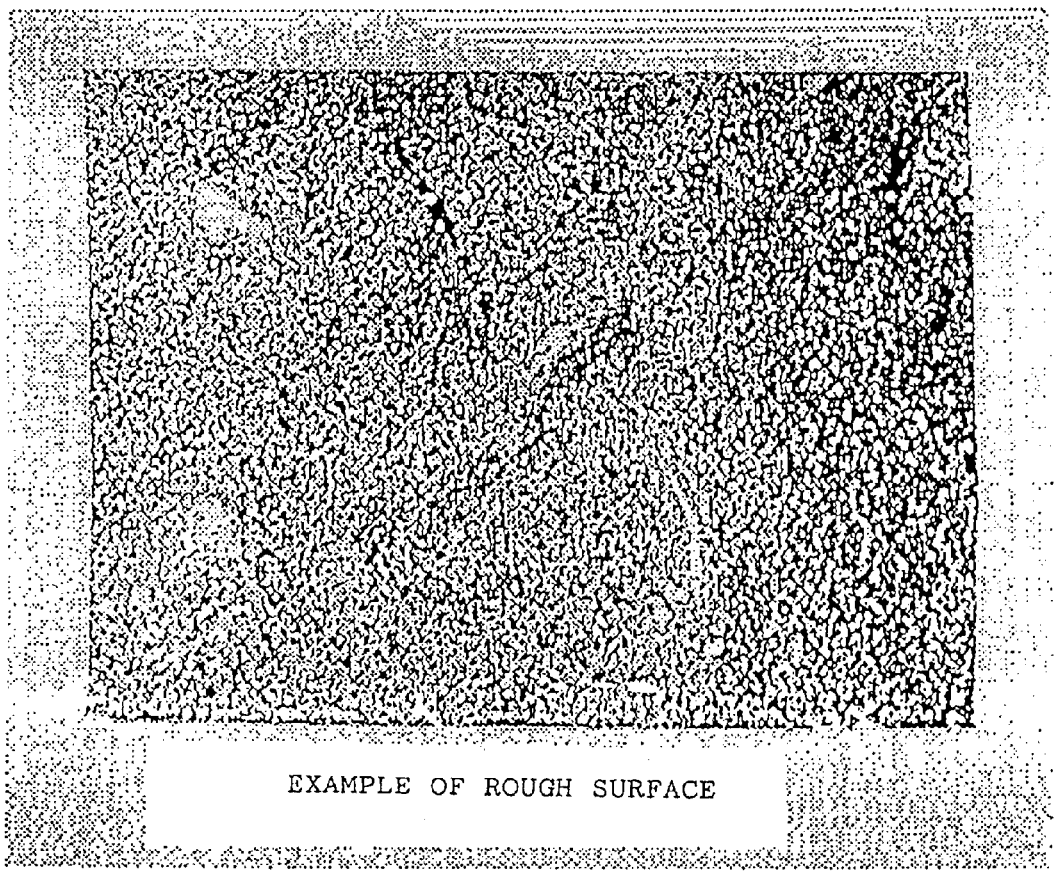
FIG. 11 is a microscopic photograph showing the surface of a film surface formed by conventional techniques.

FIG. 3 shows a planarized ultra fine particle film forming apparatus 1b according to another embodiment of the invention. A different point of the planarized ultra fine particle film forming apparatus 1b from the planarized ultra fine particle film forming apparatus 1 of the first embodiment resides in that a spray apparatus 21 is used as part of the planarizing apparatus 15. The spray apparatus 21 jets out planarizing fine particles 22 toward the deposited film 2a to grind and polish the surface of the deposited film 2a and form a planarized film 2c. The planarizing fine particles 22 are used for grinding and polishing the surface of the deposited film 2a. The planarizing fine particles 22 may be blown toward the substrate in a mixed state with the ultra fine particles 7, or blown toward the substrate by using the spray apparatus 21 separately from the ultra fine particles 7 which are supplied from the nozzle 4. In the apparatus shown in FIG. 3, the planarizing fine particles and ultra fine particles are blown separately. The spray apparatus 21 may be used in place of the attached particle removal apparatus 5 and film surface processing apparatus 6 of the planarized ultra fine particle film forming apparatus 1 of the first embodiment, or in combination with the attached particle removal apparatus 5 and film surface processing apparatus 6. As the spray apparatus 21, a nozzle or an electrostatic acceleration gun may be used. As shown in FIG. 4, the spray apparatus 21 is disposed so that planarizing fine particles 22 become obliquely incident upon the substrate in an incidence angle range of −60 degrees to −5 degrees or +5 degrees to +60 degrees between the central axis 23 of a jet flow and the normal 24 to the surface of the substrate 3. An example of the spray apparatus 21 to be used in such a case is shown in FIG. 8A. As shown in FIG. 7A, the spray apparatus 21 may be disposed so that the planarizing fine particles jetted out from the spray apparatus 21 form a conical shape having an angle range of −60 degrees to −5 degrees or +5 degrees to +60 degrees about the center of a jet flow. An example of the spray apparatus 21 to be used in such a case is shown in FIG. 8B.

If the planarizing fine particles 22 and ultra fine particles 7 are made to have the same composition, it is possible to prevent foreign material from entering the film 2. It is preferable that the planarizing fine particles 22 have a particle diameter larger than that of the ultra fine particles 7. If the planarizing fine particles 22 have a rigidity higher than that of the ultra fine particles 7, the grinding/polishing effect can be enhanced.

Planarizing a ultra fine particle film by using such an apparatus is performed in the following manner. According to a thin film forming method of this invention, when ultra fine particles collide with the substrate, they are recombined together to form a thin or thick film at a low temperature. The planarizing process is performed to planarize the surface of a deposited film of ultra fine particles to thereby form a film excellent in density, uniformity, transparency and the like. In the planarizing process of planarizing the deposited film of ultra fine particles, planarizing fine particles having the grinding/polishing function are obliquely blown toward the surface of the deposited film to thereby grind and polish the surface and obtain a flat and smooth surface. Thereafter, the same process is repeated each time after new ultra fine particles are deposited on the flat and smooth surface to increase the film thickness. Furthermore, by making the planarizing fine particles and ultra fine particles have the same composition, it is possible to prevent foreign material from entering the film.

Figure 5:
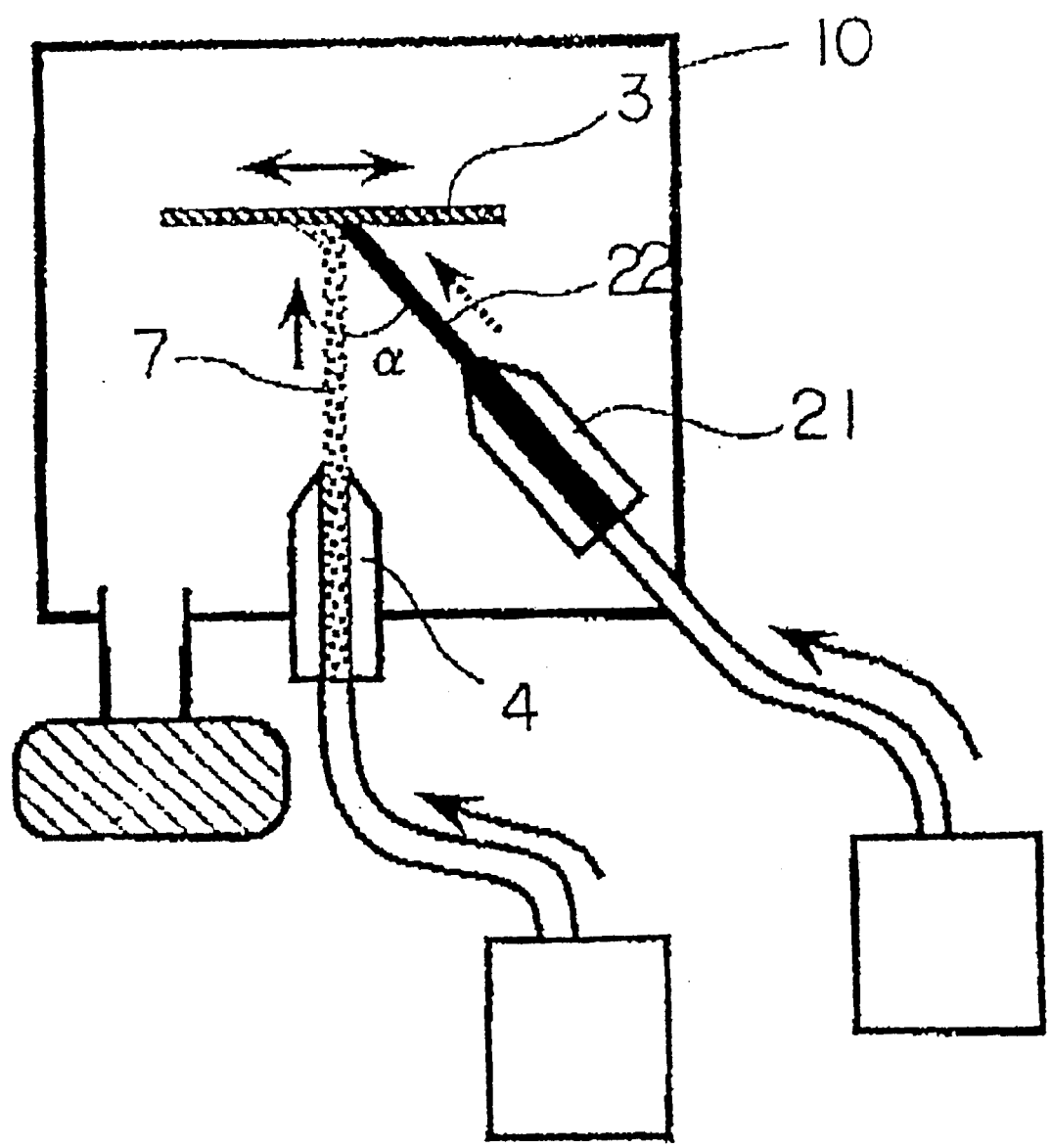
FIG. 5 is a schematic diagram showing an example of a spray apparatus for blowing ultra fine particles and planarizing particles.

An example of a spray or blowing method is illustrated in FIG. 5. As shown, ultra fine particles 7 are jetted out of the nozzle 4 and planarizing fine particles are jetted out of the spray apparatus 21, both to be applied to the same point on the substrate 3.

If a spray angle of planarizing fine particles 22 having the grinding/polishing function relative to the surface of the deposited film 2a is 0 degree (at a right angle to the substrate surface), although there is a grinding function, an impact function relative to the deposited film is greater so that the film is likely to have damages and the ground region becomes spatially irregular and discontinuous. It is therefore impossible to obtain a flat and smooth surface. In contrast, if planarizing fine particles having the grinding/polishing function are obliquely blown toward the substrate surface, the impact function relative to the deposited film becomes small and the grinding/polishing function relative to the deposited film becomes greater so that the surface of the deposited film is ground and polished spatially uniformly. It is therefore possible to obtain a flat and smooth surface. However, if the spray angle of planarizing fine particles having the grinding/polishing function relative to the surface of the deposited film becomes too large, the grinding/polishing function lowers considerably.

When the degree of the grinding/polishing effect and the damages of the surface of the deposited film are taken into consideration, it is preferable to set the spray angle of planarizing fine particles having the grinding/polishing function relative to the surface of the deposited film to the incidence angle range of −60 degrees to −5 degree or +5 degrees to +60 degrees relative to the substrate surface, although the optimum spray angle depends on the material qualities of ultra fine particles and planarizing fine particles. In blowing planarizing fine particles having the grinding/polishing function toward the surface of the deposited film, the fine particles having the grinding/polishing function may be mixed with gas and blown from a nozzle or they may be electrically charged and electrostatically accelerated and blown.

Figure 6:
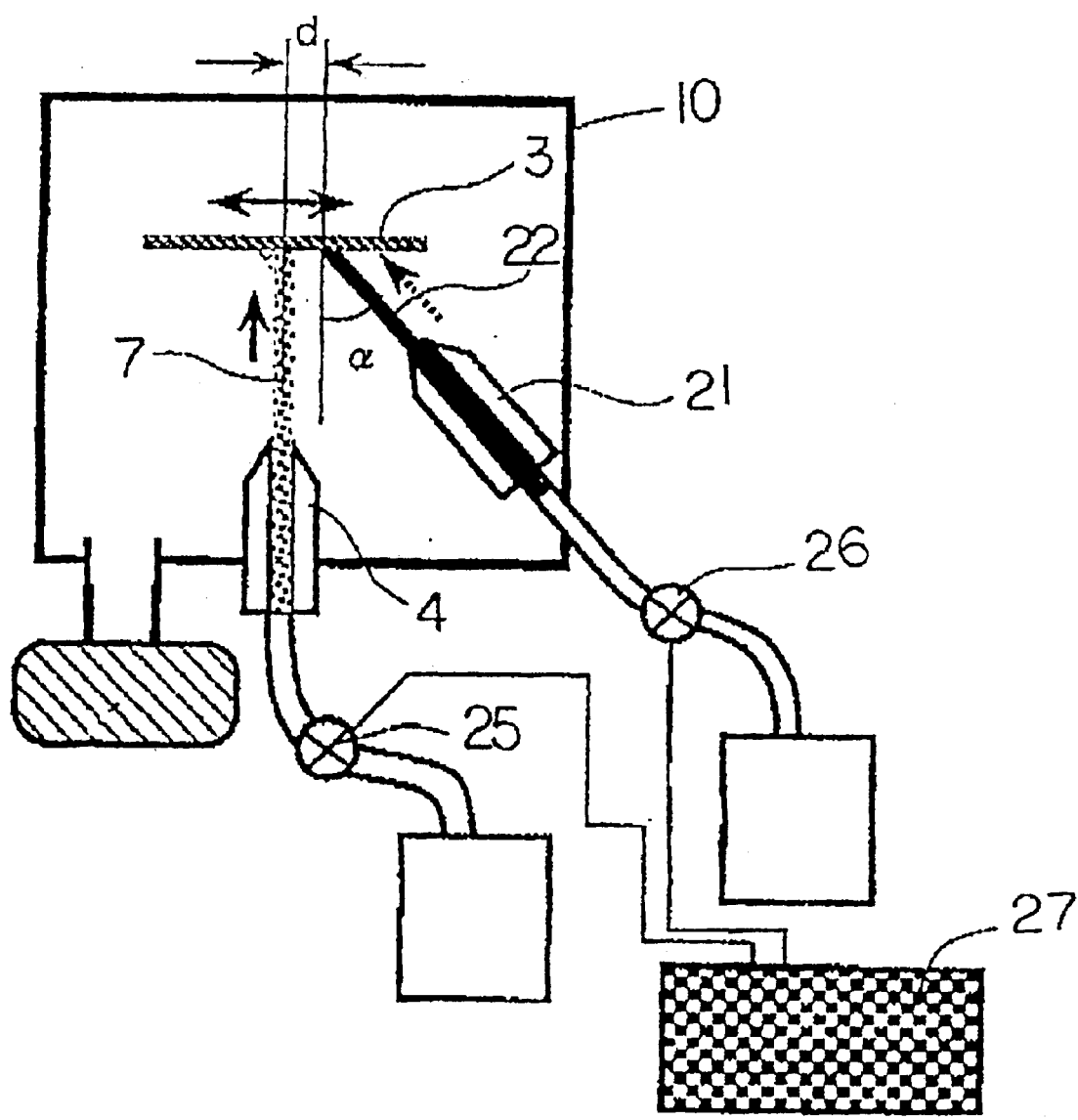
FIG. 6 is a schematic diagram showing another example of a spray apparatus for blowing ultra fine particles and planarizing particles.

In the embodiment illustrated in FIG. 5, if the ultra fine particles 7 and planarizing fine particles 22 are applied to the same position of the substrate 3, a flow of the ultra fine particles 7 for forming the deposited film 2a may be disturbed by a flow of the planarizing fine particles 22 so that a film cannot be formed stably depending upon film forming conditions. To avoid this, as shown in FIG. 6, the ultra fine particles 7 and planarizing fine particles 22 are applied to offset positions of the substrate 3, or flows of the ultra fine particles 7 and planarizing fine particles 22 may be separated in time or space by using valves 25 and 26 and a valve switching control apparatus 27, so that interference between two flows can be eliminated and a process of forming the deposited film 2a of ultra fine particles 7 and a planarizing process using planarizing fine particles 22 can be performed perfectly.

The planarizing fine particles having the grinding/polishing function may be blown toward the substrate by making them have a beam shape by using a nozzle or an electrostatic acceleration gun. Alternatively, as shown in FIG. 7A, by controlling the jet conditions of the nozzle or electrostatic acceleration gun, the planarizing fine particles having the grinding/polishing function may be blown to form a conical shape having an angle range of −60 degrees to −5 degrees or +5 degrees to +60 degrees about the center of a jet flow output from the nozzle or electrostatic acceleration gun, with similar expected advantages.

Although this conical spray shown in FIG. 7A may be performed only for the planarizing fine particles 22, it may be performed for a mixture of the planarizing fine particles 22 and ultra fine particles 7. In this case, the nozzle 4 for blowing ultra fine particles 22 can be omitted. If mixed particles are used, it is effective for the grinding/polishing function that the diameter of the planarizing fine particles 22 is larger than that of the ultra fine particles 7, as described earlier. In this case, as shown in FIGS. 7B and 7C, the particle diameter distribution pattern of mixed particles have two peaks, one by the planarizing fine particles 22 and the other by the ultra fine particles 7.

Planarizing fine particles having the grinding/polishing function mixed with ultra fine particle for forming a film are jetted out toward a substrate or a deposited film from the same nozzle or electrostatic acceleration gun so that a flat and smooth film can be formed easily. As described in JP-A-11-117328, when a film of brittle ultra fine particles is formed, a mechanical impact force sufficient for crushing ultra fine particles is necessary. In this case, an apparatus (nozzle or electrostatic acceleration gun) for blowing ultra fine particles for forming a film and an apparatus (nozzle or electrostatic acceleration gun) for blowing planarizing fine particles having the grinding/polishing function are disposed separately. Each blowing apparatus is set so that the ultra fine particles for forming a film and the planarizing fine particles having the grinding/polishing function are blown in a beam shape. In accordance with the type of ultra fine particles for forming a film, the incidence angle relative to the substrate, a jet flow density, a jet-out time, timings and the like are controlled to form a flat and smooth film at high speed.

As appreciated from the foregoing description, the invention provides techniques of forming a ultra fine particle film which has ultra fine particles sufficiently bonded together, sufficient density, flat surface and uniform density. Techniques of this invention for forming a metal ultra fine particle film through pressing and planarizing are important in forming a laminated type piezoelectric actuator of a low drive voltage or the like. The laminated type piezoelectric actuator is made of a lamination of PZT as piezoelectric material and metal such as platinum and silver as electrode material. Since the film surface can be planarized, the film optical characteristics are improved. For example, a $TiO_2$ film is optically transparent.

Even if the supply amount of ultra fine particles for forming a film is not stable, a film thickness per one grinding/polishing process can be controlled precisely. It is therefore possible to uniformly and precisely control the thickness of a large area film to be formed by repeating this process.

I claim:

1. A planarized ultra fine particle film forming method for forming a planarized ultra fine particle film from a deposited film of ultra fine particles, comprising the steps of: supplying the ultra fine particles to a substrate to form the deposited film of ultra fine particle, and planarizing a surface of the deposited film of the ultra fine particles supplied to the substrate.

2. A planarized ultra fine particle film forming method according to claim 1, wherein the ultra fine particles are ceramic or metal ultra fine particles.

3. A planarized ultra fine particle film forming method according to claim 1, wherein said planarizing step rolls, scrapes, grinds or polishes a surface layer portion of the deposited film of the ultra fine particles supplied to the substrate.

4. A planarized ultra fine particle film forming method according to claim 1, wherein said planarizing step presses a surface layer portion of the deposited film of the ultra fine particles supplied to the substrate.

5. A planarized ultra fine particle film forming method according to claim 1, wherein the deposited film is applied with a mechanical impulse force, which is equal to or greater than Vickers hardness of the ultra fine particle, to the ultra fine particles supplied to the substrate to crush the ultra fine particles and make the particles bond together.

6. A planarized ultra fine particle film forming method according to claim 5, wherein the mechanical impact force is applied to the deposited film: by accelerating ultra fine particles by an electrostatic field or gas transport and spraying the particles to and colliding the particles with the ultra fine particle on the substrate, by using a brush or roller rotating at high speed, a pressure needle moving up and down at high speed, or a piston moving at high speed by explosion forces; or by generating ultrasonic sounds.

7. A planarized ultra fine particle film forming method according to claim 5, wherein in accordance with the mechanical impact force to be applied to the ultra fine particles, the ultra fine particles are processed by a processing step enabling the ultra fine particles to be easily crushed with the mechanical impact force in excess of a mechanical strength or a brittle fracture strength of the ultra fine particle.

8. A planarized ultra fine particle film forming method according to claim 7, wherein the processing step of the ultra fine particles includes a process of the following group of processes: adjusting a preliminary baking temperature of source ultra fine particles; heating ultra fine particles prepared to have a particle diameter of about several tens nm and aggregating the particles to form secondary particles having a particle diameter of about 50 nm to 1 $\mu$m; or forming cracks in ultra fine particles so as to make the particles easy to be crushed, by using a milling apparatus, a breaker, a crusher, a ball mill, a jet mill, a vibration mill, an epicyclic mill and a bead mill.

9. A planarized ultra fine particle film forming method according to claim 1, wherein the deposited film is formed by a further step of applying an ion beam or plasma to the ultra fine particles supplied to the substrate.

10. A planarized ultra fine particle film forming apparatus for forming a planarized ultra fine particle film from a deposit film of ultra fine particles, which deposited film is formed by supplying the ultra fine particles to a substrate, the apparatus comprising: means for applying the ultra fine particles to the substrate, and means for planarizing a surface of the deposited film, the planarizing means including at least one of the following planarizing devices: an attached particle removal apparatus for rolling or scraping a surface layer portion of the deposited film of the ultra fine particles supplied to the substrate; a film surface processing apparatus for grinding or polishing the surface layer portion; and a pressure apparatus for pressing the deposited film; wherein the apparatus further comprises a mechanical impact force, which is equal to or higher than Vickers hardness of the ultra fine particles, loading apparatus for loading a mechanical impact force to the ultra fine patterns of the deposited film.

11. A planarized ultra fine particle film forming apparatus for forming a planarized ultra fine particle film from a deposited film of ultra fine particles, which deposited film is formed by supplying the ultra fine particles to a substrate, the apparatus comprising: means for applying the ultra fine particles to the substrate, and means for planarizing a surface of the deposited film, the planarizing means including at least one of the following planarizing devices: an attached particle removal apparatus for rolling or scraping a surface layer portion of the deposited film of the ultra fine particles supplied to the substrate; a film surface processing apparatus for grinding or polishing the surface layer portion; and a pressure apparatus for pressing the deposited film; wherein the apparatus further comprises a radiation apparatus for radiating an ion beam or plasma to the ultra fine patterns of the deposited film.

\* \* \* \* \*